(12) United States Patent
Koike et al.

(10) Patent No.: US 11,176,918 B2
(45) Date of Patent: Nov. 16, 2021

(54) PIEZOELECTRIC ELEMENT AND MUSICAL INSTRUMENT

(71) Applicants: YUPO CORPORATION, Tokyo (JP); YAMAHA CORPORATION, Shizuoka (JP)

(72) Inventors: Hiroshi Koike, Ibaraki (JP); Yutaro Sugamata, Ibaraki (JP); Seiichiro Iida, Tokyo (JP); Kunio Hiyama, Shizuoka (JP); Suguru Sasaki, Shizuoka (JP); Hidekazu Kodama, Tokyo (JP)

(73) Assignees: YUPO CORPORATION, Tokyo (JP); YAMAHA CORPORATION, Shizuoka (JP)

( * ) Notice: Subject to any disclaimer, the term of this patent is extended or adjusted under 35 U.S.C. 154(b) by 0 days.

(21) Appl. No.: 16/463,400

(22) PCT Filed: Nov. 29, 2017

(86) PCT No.: PCT/JP2017/042897
§ 371 (c)(1),
(2) Date: May 23, 2019

(87) PCT Pub. No.: WO2018/101359
PCT Pub. Date: Jun. 7, 2018

(65) Prior Publication Data
US 2019/0311702 A1  Oct. 10, 2019

(30) Foreign Application Priority Data
Nov. 30, 2016  (JP) .............................. JP2016-231946

(51) Int. Cl.
*G10H 3/14* (2006.01)
*H01L 41/047* (2006.01)
(Continued)

(52) U.S. Cl.
CPC ............... *G10H 3/143* (2013.01); *H01G 7/02* (2013.01); *H01L 41/047* (2013.01);
(Continued)

(58) Field of Classification Search
CPC ......... H01L 41/18; H01L 41/29; H05K 1/095; H05K 2201/026; G10H 2220/531;
(Continued)

(56) References Cited

U.S. PATENT DOCUMENTS

| 4,654,546 A | 3/1987 | Kirjavainen |
| 10,038,134 B2 | 7/2018 | Inoue et al. |

(Continued)

FOREIGN PATENT DOCUMENTS

| EP | 1298641 A1 | 4/2003 |
| JP | 5-41104 | 7/1986 |

(Continued)

OTHER PUBLICATIONS

International Search Report in International Patent Application No. PCT/JP2017/042897, dated Feb. 6, 2018.
(Continued)

*Primary Examiner* — Marlon T Fletcher
(74) *Attorney, Agent, or Firm* — Greenblum & Bernstein, P.L.C.

(57) ABSTRACT

Provision of a piezoelectric element which uses a lightweight and flexible electret material and an electrode layer which is also lightweight, has high conductivity and good flexibility to easily receive electrical signals from an electret, and has good durability. Additionally, provision of a musical instrument provided with such a piezoelectric element. A piezoelectric element comprising an electrode layer (B) on at least one surface of an electret material (A) having pores inside, wherein a porosity of the electret material (A) is 20 to 80%, the electrode layer (B) contains 20 to 70 mass % of
(Continued)

a carbon fine particle, and a thickness of the electrode layer (B) is 2 to 100 μm.

5 Claims, 2 Drawing Sheets

(51) Int. Cl.
*H01L 41/193* (2006.01)
*H01G 7/02* (2006.01)

(52) U.S. Cl.
CPC ........ *H01L 41/0478* (2013.01); *H01L 41/193* (2013.01); *G10H 2220/531* (2013.01); *H01G 7/023* (2013.01)

(58) Field of Classification Search
CPC .. G10H 2220/555; G10H 3/146; G10H 3/181; G10H 3/14; G10H 3/143
See application file for complete search history.

(56) References Cited

U.S. PATENT DOCUMENTS

| 10,439,517 B2* | 10/2019 | Wang | H02N 1/04 |
|---|---|---|---|
| 2003/0006669 A1 | 1/2003 | Pei et al. | |
| 2009/0169036 A1* | 7/2009 | Lee | H04R 19/013 |
| | | | 381/191 |
| 2011/0186437 A1* | 8/2011 | Huang | C25D 5/18 |
| | | | 205/95 |
| 2011/0255720 A1* | 10/2011 | Kao | H04R 19/013 |
| | | | 381/191 |
| 2012/0126663 A1* | 5/2012 | Jenninger | H01L 41/45 |
| | | | 310/311 |
| 2012/0177907 A1* | 7/2012 | Koike | H01G 7/023 |
| | | | 428/304.4 |
| 2012/0312585 A1 | 12/2012 | Baek et al. | |
| 2013/0018266 A1* | 1/2013 | Nishikubo | A61B 8/4488 |
| | | | 600/443 |
| 2013/0026411 A1 | 1/2013 | Jenninger et al. | |
| 2015/0071468 A1* | 3/2015 | Chiang | H04R 19/005 |
| | | | 381/191 |
| 2016/0380474 A1* | 12/2016 | Nakai | H01M 10/425 |
| | | | 320/101 |
| 2017/0324023 A1* | 11/2017 | Kondoh | H01L 41/193 |
| 2017/0331030 A1 | 11/2017 | Inoue et al. | |
| 2018/0013057 A1* | 1/2018 | Arizumi | B32B 5/028 |
| 2018/0316995 A1* | 11/2018 | Miyoshi | G10K 11/178 |
| 2018/0364113 A1* | 12/2018 | Suzuki | G01L 1/16 |
| 2019/0103548 A1* | 4/2019 | Sugawara | H02N 1/04 |
| 2019/0311702 A1* | 10/2019 | Koike | H01G 7/02 |
| 2019/0321007 A1* | 10/2019 | Hakkens | A61B 8/54 |
| 2019/0348596 A1* | 11/2019 | Pelssers | H01L 41/183 |
| 2019/0393806 A1* | 12/2019 | Koike | H01L 41/253 |

FOREIGN PATENT DOCUMENTS

| JP | 2009-59856 | 3/2009 |
|---|---|---|
| JP | 2010-89496 | 4/2010 |
| JP | 2015/061039 | 3/2015 |
| JP | 2015-186910 | 10/2015 |
| JP | 2016-39275 | 3/2016 |
| WO | WO2010/030011 A1 | 3/2010 |
| WO | WO2011/034186 | 3/2011 |
| WO | WO2013/011949 | 1/2013 |
| WO | WO2013/112849 A1 | 8/2013 |
| WO | WO2015/173732 A1 | 11/2015 |
| WO | WO 2016/121765 | 8/2016 |

OTHER PUBLICATIONS

Extended European Search Report in Counterpart European Application No. 17875574.0, dated Jul. 3, 2020.

* cited by examiner

PIEZOELECTRIC ELEMENT AND MUSICAL INSTRUMENT

TECHNICAL FIELD

The present invention relates to a piezoelectric element and a musical instrument. Specifically, the present invention relates to a piezoelectric element provided with a specific electrode layer on an electret member and having good various performances as a material for electrical and electronic input and output devices, and a musical instrument provided with such a piezoelectric element.

BACKGROUND ART

An electret is used in various forms such as a plate, a film, a sheet, a fiber, a woven fabric, and a nonwoven fabric, depending on the mode of use. Particularly, an electret filter obtained by a forming process of a nonwoven fabric or the like has been commonly used for applications such as an air filter. Further, an electret obtained by a forming process of a film or the like is increasingly used as a material for various applications such as electrical and electronic input and output devices including a speaker, a headphone, a vibration control device, a microphone, an ultrasonic sensor, and a pressure sensor.

For the film, a dielectric film wherein a conductive layer is coated on a porous structured elastic film layer has been proposed (for example, see Patent Literature 1). Additionally, for an energy conversion film, a thermoplastic resin stretched film having a specific structure is also proposed (see Patent Literature 2). An electret, when to be used for electrical and electronic input and output devices as a piezoelectric element, needs a conductive layer (so called, an electrode layer) to transduce electrical signals.

Generally, a metal with good conductivity is used because electrical signals less likely attenuate when an electrode layer has a low resistivity. For this reason, an electrode layer has been formed by depositing a metal, laminating a metal sheet, or applying a metal-containing coating material. A method for applying a conductive coating material is also known as a technique to provide an electrode layer. However, studies conducted by the present inventors revealed that performances of an electret may be deteriorated due to the penetration of a solvent when the coating method is employed. Further, it is also revealed that performances of an electret itself deteriorate when dried at a high temperature by the coating methods.

Thus, the present inventors proposed an electret film on which a conductive layer (electrode layer) having a specific surface resistivity and a dielectric film are laminated as a method for obtaining a piezoelectric element utilizing the lightweightness and flexibility of a porous resin film (see Patent Literature 3).

CITATION LIST

Patent Literature

Patent Literature 1: Japanese Patent Publication No. 05-041104
Patent Literature 2: International Publication No. WO 2011-34186
Patent Literature 3: Japanese Patent Laid-Open No. 2010-89496

SUMMARY OF INVENTION

Technical Problem

However, studies conducted by the present inventors revealed that even the above piezoelectric element does not fully demonstrate the piezoelectricity imparted by a highly flexible porous resin film. The present invention was accomplished in view of these problems. More specifically, the present invention has an object to provide a piezoelectric element which uses a lightweight and flexible electret material and an electrode layer which is also lightweight, has high conductivity and good flexibility to easily receive electrical signals from an electret, and has good durability. Additionally, the present invention has an object to provide a musical instrument provided with such a piezoelectric element.

Solution to Problem

The present inventors conducted extensive studies to solve these problems. As a result, when a specific electrode layer is provided on an electret material having pores inside, a piezoelectric element having intended properties can be provided, whereby the present invention was accomplished.

More specifically, the present invention solves the above problems by the following configuration.

1. A piezoelectric element comprising an electrode layer (B) on at least one surface of an electret material (A) having pores inside, wherein
   a porosity of the electret material (A) is 20 to 80%,
   the electrode layer (B) contains 20 to 70 mass % of a carbon fine particle, and
   a thickness of the electrode layer (B) is 2 to 100 μm;
2. The piezoelectric element according to 1, wherein the electrode layer (B) contains 20 to 70 mass % of the carbon fine particle and 30 to 80 mass % of a binder component;
3. The piezoelectric element according to 1 or 2, wherein the carbon fine particle comprises one or two or more selected from graphite, carbon black, carbon nanofiber, and carbon nanotube;
4. The piezoelectric element according to 3, wherein the carbon fine particle comprises graphite and carbon black;
5. The piezoelectric element according to any one of 1 to 4, wherein the electret material (A) is a porous resin film and has the electrode layers (B) on both surfaces of the porous resin film; and
6. A musical instrument comprising the piezoelectric element according to any one of 1 to 5.

Advantageous Effects of Invention

According to the present invention, a lightweight and flexible piezoelectric element wherein an electrode layer has high conductivity, a good response of output signals to input signals, has high surface abrasion resistance and good durability, and a musical instrument provided with such a piezoelectric element can be provided.

DESCRIPTION OF EMBODIMENTS

A piezoelectric element of the present invention can be obtained by laminating an electrode layer (B) containing a predetermined amount of carbon fine particles and having a predetermined thickness on at least one surface of an electret material (A) having pores inside.

Hereinafter, each of the members constituting a piezoelectric element of the present invention and a method for producing the same are described in detail.

[Electret Material (A)]

An electret material (A) constituting a piezoelectric element of the present invention has pores inside. The electret material (A), when having pores inside, can store charges inside and also has good recovery from compression. The electret material (A) constituting a piezoelectric element of the present invention is preferably a porous resin film.

The electret material (A) of the present invention is herein called an electret material before subjected to electretization processing. When an electret material (A) of the present invention is a porous resin film, the electret material herein has the same meaning as a porous resin film. Further, the electret material (A) is herein called an electret after subjected to the electretization processing. The electret material (A) includes both of those before and after subjected to the electretization processing. The electret material (A) is preferably an electret obtained by the electretization processing, preferably electretized by a charge injection process.

The electret material (A) preferably has electrode layers (B) on both surfaces thereof. Thus, a piezoelectric element wherein the electret material (A), as a piezoelectric transducer, having the electrode layers (B) on both surfaces thereof can be obtained.

Figure 1:
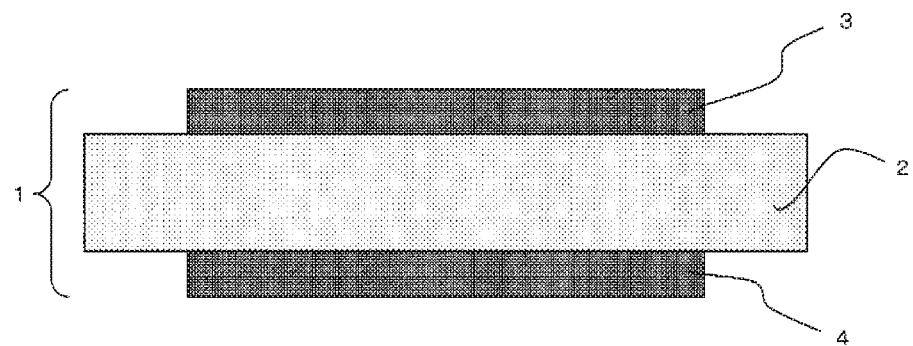
FIG. 1 is a partially enlarged cross-sectional view of an embodiment of a piezoelectric element of the present invention.

FIG. 1 shows the structure of a piezoelectric element as a particularly preferable embodiment of the present invention.

As shown in FIG. 1, a piezoelectric element 1 as an embodiment of the present invention has electrode layers (B) 3 and 4 on both surfaces of an electret material (A) 2.

The electret material (A) is preferably a multilayer resin film including a core layer and a skin layer, and is more preferably a multilayer resin film provided with a skin layer consisting of a stretched resin film at least on one surface of a core layer consisting of a stretched resin film having pores inside. The porous resin film herein may be those obtained by allowing an unreactive gas to penetrate thereinto under an applied pressure, subsequently releasing under no pressure conditions for the gas to foam thereby to adjust a porosity to a suitable value, followed by carrying out heat treatment under no pressure conditions to fix pores.

Surface treatment may be applied to the surface of the electret material (A) to enhance the adhesion to an electrode layer (B). Additionally, the electret material (A) can also be provided with an anchor layer. A piezoelectric element, when provided with the anchor layer, has a laminate structure of the electret material (A)/anchor layer/electrode layer (B).

[Porous Resin Film]

A preferable embodiment of an electret material (A) of the present invention is described in detail in reference to a case where the electret material (A) of the present invention is a porous resin film. More specifically, a preferable embodiment of the porous resin film means a preferable embodiment of the electret material (A) of the present invention.

The porous resin film has pores inside. The porous resin film includes preferably a stretched resin film, and more preferably a stretched resin film wherein a thermoplastic resin sheet obtained by containing a thermoplastic resin and a pore-forming nucleating agent is stretched under a temperature condition of lower than a melting point of the thermoplastic resin thereby to form pores inside.

In an electret, it is considered that individual pores inside a porous resin film retain different charges in pairs on the inner surface facing each other as in a capacitor. For this reason, pores preferably have at least a certain volume and height as in a single-plate capacitor for storing charges inside thereof. More specifically, for obtaining an electret with good performances having a sufficient capacitance, pores preferably have at least a certain volume. For storing charges without causing discharge (short circuit) inside the pores, the pores preferably have at least a certain height (distance). However, on the other hand, when a height (distance) of the pores is too high, it is disadvantageous for the polarization of charges, and thus a height of the pores is preferably low for obtaining an electret with good stability. Additionally, a size of the pores is preferably small for less likely causing discharge (short circuit) between adjacent pores due to the communication of adjacent pores.

Accordingly, a porous resin film preferably has, from the viewpoint of storing charges as a large amount as possible, a specific number of pores (effective to store charges) having a specific size. More specifically, on an image when observed at any cross section of a porous resin film, the film preferably has pores having a height of 3 to 30 μm in a thickness direction thereof and a diameter of 50 to 500 μm in a surface direction thereof in 100 pores/mm$^2$ or more, more preferably 150 pores/mm$^2$ or more, further preferably 200 pores/mm$^2$ or more, and particularly preferably 300 pores/mm$^2$ or more. On the other hand, the film preferably has pores having a height of 3 to 30 μm in the thickness direction thereof and a diameter of 50 to 500 μm in the surface direction thereof, from the viewpoint of reducing short circuit between adjacent pores, strength of a substrate, and recovery of compression, in 3,000 pores/mm$^2$ or less, more preferably 2,500 pores/mm$^2$ or less, further preferably 2,000 pores/mm$^2$ or less, and particularly preferably 1,500 pores/mm$^2$ or less.

Insufficient recovery from compression induces adverse effects such as deteriorating a resilience rate while compression and resilience are repeated, likely causing inconvenience for a piezoelectric element which converts a mechanical energy to an electrical energy.

The porous resin film can be obtained by melt-kneading a resin composition wherein a pore-forming nucleating agent is contained in a thermoplastic resin, which is a polymer material having good insulation, to prepare into a sheet form, and subsequently stretch forming the sheet at a temperature higher than a glass transition temperature of the thermoplastic resin and lower than a melting point of the thermoplastic resin to form pores inside the film with the pore-forming nucleating agent as a starting point (nucleus).

The porosity of an electret material (A) of the present invention is 20 to 80%. The porosity is correlated with the number of effective pores described above. The porosity of an electret material (A) refers to a volume proportion occupied by the pores in the material to a volume of an electret material (A) as a whole (volume fraction). The porosity of an electret material (A), given that the pores are evenly distributed throughout the entire material, is equal to the area proportion occupied by the pores to a cross section of the electret material (A) (area fraction).

For this reason, the porosity of an electret material (A) can be obtained by observing a cross section of the electret material (A) using a scanning electron microscope, capturing the observed image into an image analysis device, and image-analyzing the observation region to calculate an area fraction of the pores on the cross section. Specifically, a sample for cross-sectional observation is prepared from a piezoelectric element or the electret material by a technique such as a gallium focused ion beam or the like in such a way that the pores are not collapsed. Cross-sectional observation is made on the obtained sample by a suitable magnification (for example, a 2000 magnification, etc.) using a scanning electron microscope (manufactured by JEOL Ltd., product name: JSM-6490). An area proportion (area fraction) occupied by the pores in the cross section of the electret material (A) is calculated from the observation region of the obtained cross-sectional photograph using an image analyzer (manufactured by NIRECO, product name: LUZEX AP) or the like, which is defined as a porosity.

On the other hand, when a density of a composition constituting a porous resin film (a true density when there are no pores in a resin film) is known, the porosity of an electret material can also be calculated from the following formula 1. Examples of the case where a true density of a resin film is known include a case where compositions of resin compositions constituting a resin film are known, a case where a raw resin composition in which no pores are formed can be obtained, and a case where a state in which pores in a porous resin film are eliminated by hot press molding or the like can be achieved.

[Expression 1]

$$\text{Porosity}(\%) = \frac{\rho_0 - \rho}{\rho_0} \times 100 \quad \text{(Formula 1)}$$

$\rho_0$: a true density (g/cm$^3$) of resin film measured by JIS K7112
$\rho$: a density (g/cm$^3$) of a resin film measured by JIS K7222

The porosity of an electret material (A) is, from the viewpoint of obtaining a large number of pores having a suitable size for storing charges inside the electret material (A) and ensuring a storage capacitance of charges, 20% or more, preferably 25% or more, more preferably 30% or more, and further preferably 35% or more. On the other hand, the porosity of an electret material (A) is 80% or less, preferably 70% or less, more preferably 60% or less, and further preferably 55% or less, from the viewpoint of reducing short circuits of charges due to communication between pores and reducing notable impairment in the elastic modulus of a porous resin film so as not to deteriorate the resilience in a thickness direction thus resulting in poor durability.

[Employed Raw Materials for a Porous Resin Film]

A porous resin film constituting an electret material (A) preferably contains a thermoplastic resin and a pore-forming nucleating agent. Specifically, it is more preferable to contain 50 to 98 mass % of a thermoplastic resin, 49.99 to 1.99 mass % of a pore-forming nucleating agent, and 0.01 to 10 mass % of a dispersant (when the total of content ratios of the thermoplastic resin, the pore-forming nucleating agent, and the dispersant is 100 mass %).

The content of a thermoplastic rein in a porous resin film is preferably 50 mass % or more, and more preferably 70% or more, from the viewpoint of reducing the communication between pores while forming sufficient pore interfaces in the film as a matrix resin therefor and ensuring mechanical strengths of an electret material. On the other hand, the content of the resin is, from the viewpoint of forming sufficient pores in the film, preferably 98 mass % or less, and more preferably 96 mass % or less.

The content of a pore-forming nucleating agent in a porous resin film is, from the viewpoint of forming sufficient pores in the film, preferably 1.99 mass % or more, and more preferably 3.99 mass % or more. On the other hand, the content of the pore-forming nucleating agent is, from the viewpoint of reducing the communication between pores in the film, preferably 49.99 mass % or less, and more preferably 29.99 mass % or less.

Particularly when an inorganic fine powder is used as the pore-forming nucleating agent, the content of the pore-forming nucleating agent in a porous resin film is, from the viewpoint of forming sufficient pores in the film, particularly preferably 12.99 mass % or more, and the most preferably 14.99 mass % or more.

Further, when an organic filler is used as the pore-forming nucleating agent, the content of the pore-forming nucleating agent in a porous resin film is, from the viewpoint of reducing the communication between pores in the film, particularly preferably 19.99 mass % or less.

The content of a dispersant in a porous resin film is, from the viewpoint of reducing the occurrence of coarse pores and communicating pores by dispersing a pore-forming nucleating agent, preferably 0.01 mass % or more, more preferably 0.03 mass % or more, and further preferably 0.05 mass % or more. On the other hand, the content of the dispersant is, from the viewpoint of formability and charge retention, preferably 10 mass % or less, more preferably 5 mass % or less, and further preferably 2 mass % or less.

[Thermoplastic Resin]

A thermoplastic resin suitable to be used for a porous resin film is preferably an insulating polymer material which hardly conducts electricity. Usable materials include, for example, polyolefin resins such as ethylene resins including high-density polyethylene, medium-density polyethylene, and low-density polyethylene, propylene resins, polymethyl-1-pentene, and cyclic polyolefins; functional group-containing polyolefin resins such as ethylene-vinyl acetate copolymers, ethylene-acrylic acid copolymers, maleic acid modified polyethylene, and maleic acid modified polypropylene; polyamide resins such as Nylon-6 and Nylon-6,6; polyester resins such as polyethylene terephthalate and copolymers thereof, polybutylene terephthalate, polybutylene succinate, polylactic acid, aliphatic polyester; polycarbonate, atactic polystyrene, and syndiotactic polystyrene. Of these thermoplastic resins, polyolefin resins and functional group-containing polyolefin resins, which are low in hygroscopicity and high in insulation, are preferably used.

Examples of the polyolefin resin include homopolymers of olefins such as ethylene, propylene, butene, butylene, butadiene, isoprene, chloroprene, methylpentene, cyclobutene, cyclopentene, cyclohexane, norbornane, and tricyclo-3-decene, and copolymers consisting of two or more of these olefins. Specific examples of the polyolefin resin include copolymers of high-density polyethylene, medium-density polyethylene, a propylene resin, or ethylene and other olefins, and copolymers of propylene and other olefins.

Of these polyolefin resins, preferable are propylene homopolymers having isotactic, syndiotactic or various degrees of tacticity and propylene resins including a propylene copolymer wherein propylene, as a main component, and an α-olefin such as ethylene, 1-butene, 1-hexane, 1-heptane, or 4-methyl-1-pentene are copolymerized, from the viewpoint of workability, Young's modulus, durability, and cost, in addition to non-hygroscopicity and insulation.

The above propylene copolymers may be bipolymer or terpolymer and may be a random copolymer or a block copolymer.

Specific examples of the functional group-containing polyolefin resin include copolymers with a functional group-containing monomer copolymerizable with the above olefins.

Particularly representative examples of the functional group-containing monomer include styrenes such as styrene and α-methylstyrene, vinyl carboxylates such as vinyl acetate, vinyl alcohol, vinyl propionate, vinyl butyrate, vinyl pivalate, vinyl caproate, vinyl laurate, vinyl stearate, vinyl benzoate, vinyl butylbenzoate, and vinyl cyclohexanecarboxylate, acrylate esters such as (meth)acrylic acid, methyl (meth)acrylate, ethyl (meth)acrylate, butyl (meth)acrylate, hexyl (meth)acrylate, octyl (meth)acrylate, 2-ethylhexyl (meth)acrylate, stearyl (meth)acrylate, benzyl (meth)acrylate, cyclohexyl (meth)acrylate, isobornyl (meth)acrylate, dicyclopentanyl (meth)acrylate, (meth)acrylamide, and N-methylol (meta)acrylamide, and vinyl ethers such as methyl vinyl ether, ethyl vinyl ether, propyl vinyl ether, butyl vinyl ether, cyclopentyl vinyl ether, cyclohexyl vinyl ether, benzyl vinyl ether, and phenyl vinyl ether. A copolymer obtained by polymerizing one or two or more suitably selected from these functional group-containing monomers as necessary can be used.

Further, a polymer graft-modified with these polyolefin resins and functional group-containing polyolefin resins as necessary can also be used.

A known technique can be used for the graft modification, and specific examples include graft modifications by unsaturated carboxylic acid or a derivative thereof. Examples of the unsaturated carboxylic acid include (meth)acrylic acid, maleic acid, fumaric acid, and itaconic acid. Additionally, an acid anhydride, an ester, an amide, an imide, and a metal salt can also be used as a derivative of the above unsaturated carboxylic acids. Examples specifically include maleic anhydride, itaconic anhydride, citraconic anhydride, methyl (meth)acrylate, ethyl (meth)acrylate, butyl (meth)acrylate, glycidyl (meth)acrylate, monoethyl maleate ester, diethyl maleate ester, monomethyl fumarate ester, dimethyl fumarate ester, monomethyl itaconate ester, diethyl itaconate ester, (meth)acrylamide, maleic acid monoamide, maleic acid diamide, maleic acid-N-monoethylamide, maleic acid-N,N-diethylamide, maleic acid-N-monobutylamide, maleic acid-N,N-dibutylamide, fumaric acid monoamide, fumaric acid diamide, fumaric acid-N-monoethylamide, fumaric acid-N,N-diethylamide, fumaric acid-N-monobutylamide, fumaric acid-N,N-dibutylamide, maleimide, N-butylmaleimide, N-phenylmaleimide, sodium (meth)acrylate, and potassium (meth)acrylate.

Examples of the graft-modified polymer include graft-modified products wherein generally 0.005 to 10 mass %, preferably 0.01 to 5 mass %, of a graft monomer is added to at least one of the polyolefin resins and the functional group-containing polyolefin resins.

One of the above thermoplastic resins may be selected and used singly or two or more may be selected and used in combination, as a thermoplastic resin suitable to be used for a porous resin film.

[Pore-Forming Nucleating Agent]

A pore-forming nucleating agent used in a porous resin film can form pores in the film serving as a nucleus. Examples of the pore-forming nucleating agent suitable to be used for a porous resin film include inorganic fine powders and organic fillers. Stretching in the presence of a pore-forming nucleating agent enables the formation of pores in the film. Controlling the content of a pore-forming nucleating agent enables the control of frequency of pores, and controlling the particle size of a pore-forming nucleating agent enables the control of size (height and diameter) of pores.

The content ratio of a pore-forming nucleating agent is as described above, but when a content ratio of a pore-forming nucleating agent is high, pores having a size suitable for storing sufficient charges are formed during a stretching step to be described later whereby the desired piezoelectricity can be achieved. On the other hand, when a content ratio of a pore-forming nucleating agent is low, film strength deterioration is reduced and recovery from compression functions even when compressive forces are repeatedly applied whereby an electret material (A) having a stable piezoelectricity is obtained.

A volume average particle size (median size (D50) when measured using a particle size analyzer by the laser diffraction) of a pore-forming nucleating agent is selected in consideration of forming pores having a size suitable for storing charges. A volume average particle size of a pore-forming nucleating agent is, from the viewpoint of likely obtaining the desired piezoelectricity due to a suitable size of pores formed, preferably 3 µm or more, and more preferably 4 µm or more. On the other hand, a volume average particle size of a pore-forming nucleating agent is preferably 30 µm or less, more preferably 20 µm or less, and further preferably 15 µm or less, from the viewpoint of expectations in reducing charges becoming hardly storable because of the short circuit of charges caused by communication between adjacent pores due to the formation of coarse pores, in reducing film strength deterioration caused by large pores, in enabling recovery from compression to function even when compressive forces are repeatedly applied to an obtained electret, and thus in stabilizing the piezoelectricity.

[Inorganic Fine Powder]

Of the pore-forming nucleating agents, inorganic fine powders are preferable in aspects of low costs and being commercially available as a wide variety of products in different particle sizes.

Specific examples of the usable inorganic fine powder include calcium carbonate, baked clay, silica, diatom earth, clay, talc, titanium oxide, barium sulfate, alumina, zeolite, mica, sericite, bentonite, sepiolite, vermiculite, dolomite, wollastonite, and glassfiber. The inorganic fine powder can be used singly or two or more can be used in combination.

[Organic Filler]

Of the pore-forming nucleating agents, organic fillers are preferable in aspects of being available in the form of spherical particles in about the same particle sizes and thus easily forming pores having a uniform size and shape in a porous resin film. Additionally, it is also expected that pores are less likely to be collapsed even after the formation of pores since an organic filler serves as a pillar in pores and recovery from compression functions even when compressive forces are repeatedly applied to an obtained electret thereby to stabilize the piezoelectricity (pillar effect).

For the organic filler, it is preferable to select a kind of resin different from the thermoplastic resin, which is the main component of a porous resin film. When the thermoplastic resin as the main component is a polyolefin resin, specific examples of the organic filler include resins incompatible with polyolefins and nonflowable at the time of kneading and stretch forming a polyolefin resin by cross-linking such as cross-linked acrylic resins, cross-linked methacrylic resins, cross-linked styrene resins, and cross-linked urethane resins. Further, resin particles consisting of the above cross-linked resins are more preferable because they are available in the form of spherical particles with about the same particle sizes in advance thereby to easily adjust the size of pores.

The organic filler is typically incompatible with a thermoplastic resin, which is the main component of a porous resin film, but may also be an organic filler which forms a sea-island structure when melt-kneaded with a thermoplastic resin and the island, which is the organic filler, serves as a nucleus of a pore at the time of stretch forming thereby to form a desired pore. For example, when the thermoplastic resin as the main component is a polyolefin resin, specific examples of the organic filler include resins which are polymers such as polyethylene terephthalate, polybutylene terephthalate, polycarbonate, Nylon-6, Nylon-6,6, cyclic olefin polymers, polystyrene, and polymethacrylate, having a melting point (for example, 170 to 300° C.) or a glass transition temperature (for example, 170 to 280° C.) higher than a melting point of a polyolefin resin, and finely dispersible by melt-kneading in a polyolefin resin, which is a matrix resin.

The organic filler can be used singly or two or more can be used in combination. Further, an inorganic fine powder and an organic filler can also be used in combination as the pore-forming nucleating agent.

When an inorganic fine powder and an organic filler are used in combination, 1 or more of the above listed inorganic fine powders and 1 or more of the above listed organic fillers can be used in combination. When two or more pore-forming nucleating agents are used, including a case where an inorganic fine powder and an organic filler are used in combination, a volume average particle size as a mixture is preferably within the above ranges.

When two or more pore-forming nucleating agents are used in combination, pore-forming nucleating agents having about the same particle sizes or pore-forming nucleating agents having different particle sizes may be used in combination.

[Dispersant]

A dispersant used in a porous resin film enhances the dispersibility of a pore-forming nucleating agent in a thermoplastic resin. When a pore-forming nucleating agent is uniformly dispersed in a thermoplastic resin, the size, frequency, and distribution of pores formed in the film become uniform whereby an electret material with no inconsistent performances is likely to be obtained. More specifically, when a pore-forming nucleating agent is uniformly dispersed in a thermoplastic resin using a dispersant, a porous resin film having pores with the above preferable size, frequency, and distribution can be easily obtained.

When a dispersant is used in a porous resin film, it is less likely for aggregates of a pore-forming nucleating agent to remain in the film without being crushed thus causing the occurrence of coarse pores by stretching in a thickness direction. As a result, short circuit of charges caused by generation of communicating voids and deterioration in the piezoelectricity caused by deteriorated recovery from compression of a porous resin film are less likely to occur.

Specific examples of the dispersant include fatty acids such as caprylic acid, lauric acid, myristic acid, palmitic acid, stearic acid, arachidic acid, behenic acid, lignoceric acid, palmitoleic acid, oleic acid, elaidic acid, vaccenic acid, erucic acid, linoleic acid, linolenic acid, arachidonic acid, eicosapentaenoic acid, and docosahexaenoic acid; glycerol esters of fatty acids such as glycerol monostearate, glycerol monobehenate, glyceryl mono-12-hydroxystearate, glycerol monooleate, glycerol monocaprylate, glycerol monocaprate, glycerol monolaurate, glycerol distearate, glycerol dibehenate, glycerol dioleate, and diglycerol caprylate; polyglycerol esters of fatty acids such as diglycerol laurate, diglycerol myristate, diglycerol stearate, diglycerol oleate, tetraglycerol stearate, decaglycerol laurate, decaglycerol stearate, decaglycerol oleate, and polyglycerol polyricinoleate; sorbitan esters of fatty acids such as sorbitan laurate, sorbitan palmitate, sorbitan stearate, sorbitan tristearate, sorbitan oleate, sorbitan trioleate, sorbitan tribehenate, and sorbitan caprylate; ethylene oxide adducts such as polyoxyethylene sorbitan trioleate and polyoxyethylene glycerol monostearate; silane coupling agents such as vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, and 3-acryloxypropyltrimethoxysilane; polyacrylic acids or salts thereof, and polymethacrylic acids or salts thereof. The dispersant may be used singly or two or more may be used in combination. Of these dispersants, it is preferable to use a fatty acid having a small effect on electrical properties of a thermoplastic resin, which is the main component.

[Other Materials]

A heat stabilizer (antioxidant) and a light stabilizer can be used as necessary in a thermoplastic resin composition used for a porous resin film.

A heat stabilizer, when used, is typically used within a range from 0.001 to 1 mass % to a thermoplastic resin composition. Specific examples of the heat stabilizer usable include those of sterically hindered phenol-based, phosphorus-based, and amine-based.

A light stabilizer, when used, is typically used within a range from 0.001 to 1 mass % to a thermoplastic resin composition. Specific examples of the light stabilizer usable include those of sterically hindered amine-based, benzotriazole-based, and benzophenone-based.

The porous resin film is, as described above, preferably a multilayer resin film including a core layer and a skin layer.

[Core Layer]

In this case, it is typically preferable that the porous resin film described above be a core layer and a skin layer be laminated on a surface thereof.

[Skin Layer]

The skin layer is preferably provided on a surface of a porous resin film as a layer for protecting the core layer. When a skin layer is provided on a surface of a porous resin film, it is likely to prevent that pores formed in the porous resin film communicate with outside whereby charges stored inside are atmospherically discharged. Additionally, the surface strength of a porous resin film can be enhanced. When the surface is made smooth by a skin layer, the adhesion to an electrode layer (B) can also be enhanced. The skin layer is preferably a stretched resin film.

A skin layer preferably has a composition which is less likely to form pores than a core layer or has a structure having a low porosity. Such a skin layer can be produced by using a pore-forming nucleating agent having a smaller particle size than an agent used for producing a core layer, reducing the content of a pore-forming nucleating agent, reducing the number of times of stretching, and reducing a stretch ratio.

For the thermoplastic resin constituting a skin layer, the resins listed as the thermoplastic resins used for a porous resin film can be used.

A skin layer may or may not contain a pore-forming nucleating agent. A skin layer preferably contains a pore-forming nucleating agent from the viewpoint of improving electrical properties such as the dielectric constant of a skin layer. When a skin layer contains a pore-forming nucleating agent, the same agent as those listed in the section of the pore-forming nucleating agent used for a porous resin film can be used. A pore-forming nucleating agent in a skin layer may be the same kind of a pore-forming nucleating agent as, or may be a different kind of a pore-forming nucleating agent from, those used in the porous resin film.

An organic filler, generally having a higher dielectric constant than a thermoplastic resin, is particularly suited for improving electrical properties of a skin layer. When a resin having a low dielectric constant such as a polyolefin resin is particularly used as the thermoplastic resin of a skin layer, charges are likely to be delivered inside a porous resin film by a dielectric effect at the time of applying a high voltage during the electretization processing due to an organic filler contained in the skin layer. Conversely, an effect of retaining, without discharging, charges inside a porous resin film can be obtained because of low dielectric properties of a polyolefin resin as the main component after the electretization processing.

When a skin layer contains a pore-forming nucleating agent, the dispersants listed as those used for a porous resin film can be preferably used in combination.

A skin layer is preferably stretched. A stretching step to be described later can enhance the uniformity in the thickness (film thickness) of a skin layer and the uniformity in electrical properties such as insulation pressure resistance. When a thickness of a skin layer is uniform, the occurrence of locally-concentrated discharge at a thinner part of a skin layer is likely to be reduced at the time of charge injection using a high voltage and a voltage is easily increased because the charge injection is effectively conducted.

A skin layer may not only have a single layer structure but may also have a multilayer structure of two or more layers. When a skin layer has a multilayer structure, changes in the kind and content of a thermoplastic resin, a pore-forming nucleating agent, and a dispersant used in each layer enable to design a porous resin film provided with a higher charge retention performance.

A skin layer is preferably provided on at least one surface, and more preferably provided on both surfaces, of a porous resin film. When a skin layer is provided on both surfaces of a porous resin film, the compositions and structures of the upper and lower skin layers respectively may be the same or different.

When a skin layer is provided on the upper surface of a porous resin film, a thickness thereof is preferably 0.1 µm or more, more preferably 0.3 µm or more, further preferably 0.5 µm or more, and particularly preferably 0.7 µm or more. With these ranges, a uniform skin layer is easily provided, whereby a uniform charge injection and enhancement in insulation pressure resistance can be expected. On the other hand, a thickness of a skin layer is preferably 200 µm or less, more preferably 100 µm or less, further preferably 50 µm or less, and particularly preferably 30 µm or less. With these ranges, when charges are injected to a porous resin film, there is a tendency for charges to be easily delivered inside a porous resin film. Additionally, a skin layer is not likely to relatively elastically deform in a thickness direction, due to which when a thickness of a skin layer is reduced, the compressive modulus of a porous resin film is not deteriorated and thus the piezoelectricity tends to be easily maintained.

[Production of a Porous Resin Film]

Various conventionally known methods can be employed for producing a porous resin film. For example, when a porous resin film is a single layer film, a resin composition containing the above raw materials is melt-kneaded, extruded through a single die, and stretched. Further, when a porous resin film is multilayered, both layers are laminated for the production by a co-extrusion method with a multi-layer die using a feedblock or multi-manifold, or an extrusion lamination method using a plurality of dies. Further, a porous resin film can also be produced by a combination of the co-extrusion method with a multilayer die and the extrusion lamination method.

The higher the uniformity in thickness of a porous resin film is, the insulation pressure resistance is enhanced and thus a charge injection efficiency is enhanced whereby consequently a piezoelectric efficiency is enhanced, hence the uniformity in thickness of a porous resin film is important. A porous resin film, when having a skin layer, is preferably stretched after the skin layer is laminated thereon. By stretching after lamination of a skin layer, the uniformity of a film thickness is more enhanced than laminating stretched films with each other, and consequently electrical properties are enhanced.

In the present invention, a porous resin film is preferably a stretched film. By stretching, a large number of pores are formed inside the porous resin film. It is desirable that pores formed in the porous resin film have, from the viewpoint of retaining charges, a comparatively large individual volume, be present in a comparatively large number, and have independent shapes from each other. The size of pores can be made larger by stretching in biaxial directions rather than stretching only in one direction. Particularly, by stretching in biaxial directions of a width direction and a machine direction, disc-shaped pores stretched in a plane direction can be formed whereby charges positively and negatively polarized in pores by the electretization processing can be easily stored and a charge retention performance is likely to be enhanced. Thus, it is preferable that a porous resin film be biaxially stretched.

Stretching a porous resin film can be carried out by various known methods. Specifically, examples include a longitudinal stretching method utilizing peripheral speed differences of a roll group, a lateral stretching method using a tenter oven, a sequential biaxial stretching method wherein the above longitudinal stretching and the lateral stretching are carried out in the right order or the reverse order, a rolling method, a simultaneous biaxial stretching method of a tenter oven and a linear motor in combination, a simultaneous biaxial stretching method of a tenter oven and a pantograph in combination, and a simultaneous biaxial stretching method by a tubular method, which is a stretching method of an inflation film.

The stretching of a porous resin film is preferably carried out, from the viewpoint of pore formation, from a glass transition temperature of a primary thermoplastic resin used for a porous resin film to a temperature up to a melting point of a crystalline part of the primary thermoplastic resin. Additionally, a porous resin film composed of a multilayer laminate is stretched, a stretching temperature is preferably determined in consideration of the stretching efficiency of a layer having the highest set basis weight (typically core layer) or a layer having the highest set porosity (typically core layer).

Of these, the stretching temperature at the time of stretching is preferably a temperature higher than a glass transition temperature of a thermoplastic resin used in the largest amount in terms of mass ratio for a porous resin film and a temperature 1 to 70° C. lower than a melting point of the thermoplastic resin. Specifically, when the thermoplastic resin is a propylene homopolymer (melting point 155 to 167° C.), the stretching temperature is preferably within a range from 100 to 166° C., and when the thermoplastic resin is a high-density polyethylene (melting point 121 to 136° C.), the stretching temperature is preferably within a range from 70 to 135° C.

Understandably, when the stretching temperature is determined using thermoplastic resins having different melting points and glass transition temperatures for the core layer and the skin layer respectively of a porous resin film, a porosity of each layer is adjustable.

The stretch ratio is not particularly limited and suitably determined in consideration of stretch properties and the aforementioned set porosity of a thermoplastic resin used for a porous resin film.

The stretch ratio of a porous resin film such as a thermoplastic resin is, in the case of stretching in a uniaxial direction, 1.2 times or more, and more preferably 2 times or more. Further, the stretch ratio is, in the case of stretching in biaxial directions, preferably 1.5 times or more, and more preferably 4 times or more, in terms of area stretch ratio (a product of a longitudinal stretch ratio and a lateral stretch ratio).

Particularly, the stretch ratio is, in the case of using a propylene homopolymer or a copolymer thereof as a thermoplastic resin and stretching in a uniaxial direction, preferably 12 times or less, and more preferably 10 times or less. Further, the stretch ratio is, in the case of stretching in biaxial directions, preferably 60 times or less, and more preferably 50 times or less, in terms of area stretch ratio (a product of a longitudinal stretch ratio and a lateral stretch ratio).

The stretch ratio is, in the case of using other thermoplastic resins and stretching in a uniaxial direction, preferably 10 times or less, and more preferably 5 times or less. Further, the stretch ratio is, in the case of stretching in biaxial directions, preferably 20 times or less, and more preferably 12 times or less, in terms of area stretch ratio.

In the case of stretching in biaxial directions, the longitudinal stretch ratio and a lateral stretch ratio are determined to be about the same degree of stretch ratios whereby disk-shaped pores easily storing charges are formed and thus the shape and frequency of the pores when observed cross sectionally in any direction are easily adjusted to preferable ranges of the present invention. For this reason, when the stretching is carried out in biaxial directions, a ratio of the longitudinal stretch ratio and the lateral stretch ratio is preferably 2.5 or less, more preferably 2.0 or less, further preferably 1.5 or less, and particularly preferably 1.3 or less. On the other hand, a ratio of the longitudinal stretch ratio and the lateral stretch ratio is preferably 0.4 or more, more preferably 0.5 or more, further preferably 0.7 or more, and particularly preferably 0.8 or more.

Further, the stretch speed is, from the viewpoint of stable stretch forming, preferably within a range of 20 to 350 m/min.

[Surface Treatment]

Surface treatment can be applied to a porous resin film to enhance the adhesion to an electrode layer (B) to be described later. Specific examples of the surface treatment include known techniques such as corona discharge treatment, frame plasma treatment, and atmospheric pressure plasma treatment, and when treatment environment or a plasma source is replaced with a desired gas, higher adhesion can be obtained. Alternatively, the adhesion can also be enhanced by washing the surface of a porous resin film using an acid such as hydrochloric acid, nitric acid, or sulfuric acid.

[Anchor Coat Layer]

An anchor coat layer may be provided on the surface of a porous resin film to further enhance the adhesion to an electrode layer (B).

A polymer binder is preferably used for the anchor coat layer from the viewpoint of adhesion, and specific examples of the polymer binder include polyethyleneimine polymers such as polyethyleneimine, alkyl-modified polyethyleneimine having 1 to 12 carbon atoms and poly(ethyleneimine-urea); polyamine polyamide polymers such as ethyleneimine adducts of polyamine polyamide and epichlorohydrin adducts of polyamine polyamide; acrylate ester polymers such as acrylic acid amide-acrylate ester copolymers, acrylic acid amide-acrylate ester-methacrylate ester copolymers, polyacrylamide derivatives, and oxazoline group-containing acrylate ester polymers; polyvinyl alcohol polymers containing polyvinyl alcohol and a modified product thereof; water-soluble resins such as polyvinylpyrrolidone, and polyethylene glycol; polypropylene polymers such as chlorinated polypropylene, maleic acid modified polypropylene, and acrylated polypropylene, and additionally thermoplastic resins diluted with an organic solvent or diluted with water such as polyvinyl acetate, polyurethane, ethylene-vinyl acetate copolymers, polyvinylidene chloride, acrylnitrile-butadiene copolymers, and polyesters. Of these, polyethyleneimine polymers, polyamine polyamide polymers, polyvinyl alcohol polymers, or polypropylene polymers have good adhesion to the porous resin film, hence preferable.

The basis weight of an anchor coat layer provided on a porous resin film is, in terms of solid content, preferably $0.001 \text{ g/m}^2$ or more, more preferably $0.005 \text{ g/m}^2$ or more, and particularly preferably $0.01 \text{ g/m}^2$ or more, as the adhesion to a porous resin film is good. On the other hand, the basis weight of the layer is, from the viewpoint of maintaining a uniform film thickness of the anchor coat layer, which is a coating layer, preferably $5 \text{ g/m}^2$ or less, more preferably $3 \text{ g/m}^2$ or less, and particularly preferably $1 \text{ g/m}^2$ or less. When a uniform film thickness of the anchor coat layer is maintained, the uniformity in the electrical properties of a porous resin film is easily maintained. Additionally, when a uniform film thickness of the anchor coat layer is maintained, it is likely to prevent that the adhesion between a porous resin film and an electrode layer (B) is deteriorated because of an insufficient cohesive force of the anchor coat layer itself and a surface resistance value of the anchor coat layer is decreased to below $1 \times 10^{13} \Omega$ likely discharging charges moving along the surface whereby charges are not easily injected at the time of electretization of a porous resin film, failing to be delivered to the porous resin film where intended performances of the present invention are less likely to be expressed.

A method for providing an anchor coat layer on a porous resin film is preferably a method for applying an application liquid containing the above polymer binder onto a porous resin film. Specifically, a coating film of the above application liquid is formed on a porous resin film using a known coating applicator and dried to thereby form the layer.

Specific examples of the coating applicator include a die coater, a bar coater, a comma coater, a lip coater, a roll coater, a curtain coater, a gravure coater, a spray coater, a squeeze coater, a blade coater, a reverse coater, an air knife coater, and a size press coater.

Timing to provide an anchor coat layer on a porous resin film may be before or after the electretization processing to be described later.

[Thickness of a Porous Resin Film]

The thickness of a porous resin film is a total thickness when measured using a thickness meter based on JIS K7130: 1999 "Plastics—film and sheeting—determination of thickness."

When the porous resin film is a film having a multilayer structure, the thickness of each layer constituting the film is determined as follows.

A sample to be measured is cooled to a temperature of −60° C. or less using liquid nitrogen, and cut while laid on a glass plate with a razor blade positioned at a right angle to prepare the sample for cross section measurement. Cross-sectional observation is made on the obtained sample by using a scanning electron microscope to discriminate boundary lines of each layer based on pore shapes and composition appearances, and a proportion occupied by a thickness of each layer determined from the observed image in the total thickness of the porous resin film is determined. Further, the film total thickness determined using a thickness meter is multiplied by the thickness proportion of each layer for determination.

A thickness of a porous resin film is preferably 10 µm or more, more preferably 20 µm or more, and particularly preferably 30 µm or more. With these ranges, pores having a size which effectively functions for energy conversion in a desired number can be uniformly formed. On the other hand, a thickness of a porous resin film is preferably 500 µm or less, more preferably 300 µm or less, and particularly preferably 150 µm or less. With these ranges, charges can be delivered inside the layer at the time of electretization by charge injection (DC high voltage discharge processing), whereby desired performances of the present invention can be demonstrated.

[Pressure Treatment]

When pressure treatment is applied to a porous resin film, the pores inside can further be expanded. Pressure treatment can be carried out by placing a porous resin film into a pressure vessel, applying a pressure using an unreactive gas thereby to allow the unreactive gas to penetrate inside the pores, followed by releasing under no pressure conditions. Specific examples of the unreactive gas usable include inert gases such as nitrogen, carbon dioxide, argon, and helium, mixed gases of these, and air. Even when a gas other than the unreactive gas is used, an expansion effect can be obtained but it is desirable to use an unreactive gas from the viewpoint of safety during pressure treatment and safety of the obtained porous resin film. A pressure applied during pressure treatment ranges from preferably 0.2 to 10 MPa, more preferably 0.3 to 8 MPa, and further preferably 0.4 to 6 MPa. When a pressure applied during pressure treatment is high, an expansion effect is easily obtained. On the other hand, when a pressure applied during pressure treatment is low, the pores unable to withstand an inner pressure when released are likely to be prevented from bursting and thus a condition of independent pores is easily maintained. The time for pressure treatment ranges from preferably 1 hour or more, and more preferably 1 to 50 hours. When a time for pressure treatment is long, an unreactive gas tends to sufficiently fill in the pores. Additionally, when a time for pressure treatment is long, diffusion of an unreactive gas is less likely to occur during heat treatment to be described later even with a porous resin film wherein an unreactive gas fills in the pores whereby a stable expansion ratio is easily obtained.

When a pressure is applied to a porous resin film by winding, it is desirable to prepare the resin film wound up together with a buffer sheet so that an unreactive gas easily penetrates inside the wound film. Specific examples of the buffer sheet usable include sheets having communicating pores such as foamed polystyrene sheet, foamed polyethylene sheet, foamed polypropylene sheet, nonwoven fabric, paper, and cloth. The resin film wound up with such a buffer sheet is placed in a pressure vessel and pressurized with an unreactive gas to carry out pressure treatment.

[Heat Treatment]

Typically, the porous resin film subjected to pressure treatment also needs heat treatment. The porous resin film, subjected to pressure treatment and brought back under no pressure conditions, expands. However, the penetrated unreactive gas gradually comes out and the film returns to the original thickness. When heat treatment is carried out, an expansion effect can be maintained even after the unreactive gas comes out and the inside of the pores decreases to atmospheric pressure. The heat treatment can be carried out within a known temperature range suitable for stretching a thermoplastic resin, which is higher than a glass transition temperature and lower than a melting point of a crystalline part of a thermoplastic resin primarily used for a porous resin film. For example, when a thermoplastic resin is a propylene homopolymer (melting point 155 to 167° C.), a temperature at heat treatment is within a range from 80 to 160° C. Heating method can employ a known technique. Specific examples include hot air heating by a hot air from a nozzle, radiation heating using an infrared heater, and contact heating using rollers equipped with a temperature controlling function. A porous resin film during heat treatment has a low elastic modulus and is easily collapsed when a weight is applied, and thus when a non-contact method such as the hot air heating or the radiation heating is used, a higher expansion ratio easily tends to be obtained.

[Electret]

When the above porous resin film is electretized, an electret retaining charges in the film can be obtained.

[Electretization]

Examples of the electretization processing include several processing methods. For example, a method wherein both surfaces of a porous resin film are held with conductors and a DC high voltage or a pulsed high voltage is applied (electro-electretization method) and an electretization method by irradiation of a γ-ray or an electron beam (radio electretization method) are known.

Of these, the electretization processing method wherein DC high voltage discharge is used (electro-electret method) is preferable because a device is small-sized and burdens on workers and an environment are small, and suitable for electretization processing of a polymer material such as a porous film.

Figure 2:
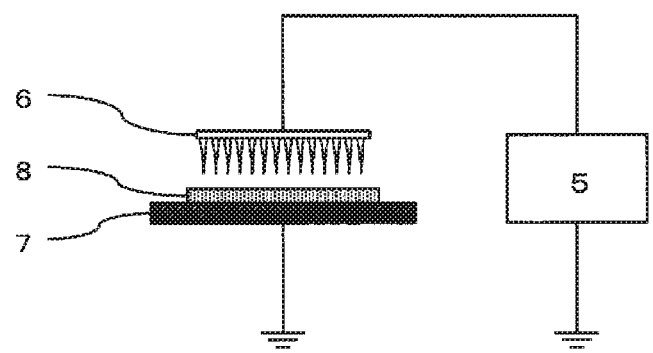
FIG. 2 is an example of an electretization device used in the present invention.

An example of the electretization device used in the present invention is a method wherein a porous resin film 8 is fixed between a needle electrode 6 connected to a DC high voltage power supply 5 and a ground electrode 7 as shown in FIG. 2 and a predetermined voltage is applied.

A porous resin film can store charges in a large amount as possible inside by the electretization processing by DC high voltage discharge.

An applied voltage during the electretization processing is variable depending on the thickness and porosity of a porous resin film, the materials of a resin and a filler used, processing speed, the shape, material, and size of an electrode used, and the final charge amount to be obtained, but is preferably 5 kV or more, more preferably 6 kV or more, and further preferably 7 kV or more. With these ranges, a sufficient charge amount can be injected to demonstrate the piezoelectricity. On the other hand, an applied voltage during the electretization processing is preferably 100 kV or less, more preferably 70 kV or less, and further preferably 50 kV or less. With these ranges, it is likely to prevent phenomena wherein a locally-concentrated spark discharge occurs during the electretization processing causing a partial breakage such as a pinhole in a porous resin film, and an electric current easily moves from the surface of a porous resin film to a ground electrode along an edge during the electretization processing resulting a poor efficiency in the electretization.

During the electretization processing, charges are sometimes injected excessively in a porous resin film. In this case, an electret suffers from discharge after processed and inconvenience may be caused during a tail-end process. For preventing it, a charge elimination processing of excessive charges may be carried out after the electretization processing. More specifically, the charge elimination processing, when conducted, can remove excessive charges given by the electretization processing to prevent the discharge phenomenon of an electret.

For the charge elimination processing, a known technique such as a voltage application charge eliminator (ionizer) and a self-discharge charge eliminator can be used. These general charge eliminators are preferably used in such a way that surface charges on a porous resin film can be removed but charges stored inside, particularly in the pores of, a porous resin film cannot be removed. In this way, significant deterioration in the performances of an electret material caused by the charge elimination processing can be prevented.

An electretization processing is desirably carried out at a temperature higher than a glass transition temperature and lower than a melting point of a crystalline part of a thermoplastic resin primarily used for a porous resin film. When a processing temperature is higher than a glass transition temperature, a molecular motion at an amorphous part of a thermoplastic resin is active and a molecular arrangement suitable for charges given is formed thereby to enable the electretization processing with a good efficiency to be carried out. On the other hand, when a processing temperature is lower than a melting point of a thermoplastic resin primarily used for a porous resin film, the porous resin film itself can maintain the structure thereof and intended performances of the present invention are easily obtained.

[Electrode Layer (B)]

A piezoelectric element of the present invention has an electrode layer (B) on at least one surface of an electret material (A). The electrode (B) is a conductive layer for efficiently transmitting electrical signals from the electret material (A) to outside the system when physical input signals are given to the electretized electret material (A).

The electrode layer (B) contains 20 to 70 mass % of carbon fine particles, and preferably contains 30 to 80 mass % of a binder component.

[Carbon Fine Particle]

Carbon fine particles generally have a low conductivity compared with a piezoelectric element which uses a metal particle but are capable of forming a lightweight electrode layer (B) due to a low density and featured that even when an electrode layer having a film thickness to the extent of obtaining abrasion resistance is formed, a weight of the electrode (B) hardly increases. For this reason, the electrode layer (B) used for a piezoelectric element of the present invention is preferably thicker compared with a conventional electrode layer in which a metal particle is used.

The content of carbon fine particles in the electrode layer (B) is 20 to 70 mass %, preferably 30 to 65 mass %, and more preferably 40 to 60 mass %.

Representative examples of the carbon fine particle include graphite and carbon black, and other examples also include carbon nanofiber (CNF), carbon nanotube (CNT), carbon nanobud, and fullerene. Of these, a combination of one or two or more selected from graphite, carbon black, carbon nanofiber, and carbon nanotube is preferable from the viewpoint of good conductivity, with graphite and carbon black being more preferable due to easy handleability.

Specific examples of the graphite include natural graphite such as amorphous graphite, flaky graphite, and scaly graphite, acid-treated graphite obtained by acid-treating a natural graphite, expanded graphite obtained by expanding acid-treated graphite by heating, artificial graphite produced by mixing pitch coke and coal tar with crushed coal coke, forming under an applied pressure, and subsequently igniting in a furnace or the like. Of these, flaky graphite is preferable.

Specific examples of the carbon black include acetylene black, Ketjen black, channel black, and furnace black obtained by incomplete combustion or thermal decomposition of acetylene gas, natural gas, petroleum, coal, or wood. Of these, acetylene black or Ketjen black is preferable.

Carbon black used in the present invention is preferably those having a BET specific surface area of 800 to 1500 m/g and a DBP oil absorption amount of 300 to 600 ml/100 g. When a BET specific surface area is large or a DBP oil absorption amount is high, a desired conductivity is easily obtained without using a large amount of carbon black in an electrode layer (B). Additionally, the deterioration in a cohesive force (abrasion resistance) of the electrode (B) and an issue of dropping out of carbon black are likely to be prevented. On the other hand, when a BET specific surface area is small or a DBP oil absorption amount is high, the dispersibility of carbon black in the electrode (B) tends to be better.

These carbon fine particles may be used singly or two or more may be used in combination. Particularly, when graphite and carbon black are used in combination, the carbon black fills gaps in the graphite thereby to increase a contact ratio between fine particles whereby an electrode layer (B) with good conductivity is easily obtained, because of which the electrode layer (B) of the present invention preferably contains graphite and carbon black. In this case, a carbon black/graphite ratio is more preferably 1/10 to 10/1, further preferably 2/10 to 10/3, and particularly preferably 3/10 to 10/5. When a carbon black is in a relatively higher ratio, the conductivity is likely to be enhanced by the intervention of carbon black whereby an electrode layer (B) with high conductivity intended by the present invention is likely to be obtained. On the other hand, when graphite is in a relatively higher ratio, good conductivity is likely to be obtained.

Note that the carbon fine particle is typically chemically stable and can maintain the original particle even when subjected to heat treatment at lower than an autoignition point or acid treatment. For this reason, the content of carbon fine particles in the electrode layer (B) can be confirmed when only the electrode layer (B) is politely collected from a piezoelectric element, after measuring a dry weight thereof, subsequently heated for 24 hours or more in a furnace at a temperature lower than the autoignition point of carbon fine particles, preferably at 200 to 300° C., to remove other components such as a binder component by perfect combustion, followed by measuring a dry weight of the remaining carbon particles. When the electrode layer (B) contains inorganic fine particles, the content of carbon fine particles can be confirmed by further acid treatment to remove the inorganic fine particles. The particle size, shape, ratio, and structure of carbon fine particles can be confirmed by cross-sectional observation of the electrode layer (B) using an electron microscope or the like.

[Binder Component]

The electrode layer (B) preferably contains a binder component in addition to carbon fine particles. The binder component fixes carbon fine particles on an electret material (A), reduces the carbon fine particles from dropping out from a piezoelectric element, and enhances the abrasion resistance of the electrode layer (B) surface. However, the larger an amount of carbon fine particles in the electrode layer (B) is, the relatively higher a contact ratio between carbon fine particles becomes. Thus, an amount of carbon fine particles in the electrode layer (B) is typically 30 to 80 mass %, preferably 35 to 70 mass %, and more preferably 40 to 60 mass %. Specific examples of the binder component include acrylic resins, urethan resins, ether resins, ester resins, epoxy resins, vinyl acetate resins, vinyl chloride resins, vinyl chloride-vinyl acetate copolymers, amide resins, melamine resins, phenol resins, vinyl alcohol resins, and modified-polyolefin resins.

[Other Components]

Other components in addition to the carbon fine particle and the binder component may be used in the electrode layer (B) within a range wherein the effects of the present invention are not significantly affected. For example, particles in different kinds from the carbon fine particles can be used in the electrode layer (B). When other particles are used, the abrasion resistance, flexibility, and tensile strength of the electrode layer (B) can be improved. Specific examples of the other particles include inorganic fine particles such as calcium carbonate, baked clay, silica, diatom earth, clay, talc, titanium oxide, barium sulfate, alumina, zeolite, mica, sericite, bentonite, sepiolite, vermiculite, dolomite, wollastonite, and glassfiber, and organic fine particles such as acrylic resin particle, olefin resin particle, and styrene resin particle. The content of other particles in the electrode layer (B) is, from the viewpoint of conductivity, preferably 0 to 30 mass %, more preferably 0 to 20 mass %, and further preferably 0 to 10 mass %.

A leveling agent, a plasticizer, a dispersant, an anti-setting agent, a lubricant, and a matting agent may further be used in the electrode layer (B).

The electrode layer (B) preferably contains 20 to 70 mass % of carbon fine particles and 30 to 80 mass % of a binder component, more preferably 30 to 65 mass % of carbon fine particles and 35 to 70 mass % of a binder component, and more preferably 40 to 60 mass % of carbon fine particles and 40 to 60 mass % of a binder component.

When the content of carbon fine particles is more than the above ranges, sufficient conductivity of the electrode (B) is obtained whereby a high performance piezoelectric element is likely to be obtained. On the other hand, when the content of the binder component is more than the above ranges, it is likely to prevent that cracks are caused in the electrode layer (B) while using due to a deteriorated cohesive force of the electrode layer (B) and the function as a piezoelectric element deteriorates.

[Formation of Electrode Layer (B)]

An electrode layer (B) can be formed by applying a conductive coating material wherein a raw material containing carbon fine particles is dispersed in a volatile solvent using a known coating applicator or a printer on at least one surface of an electret material (A), or by forming a coating film by printing and drying the coating film. An electrode layer (B) can be efficiently formed on a long electret material (A), whereby a piezoelectric element with high mass productivity can be provided.

Specific examples of the volatile solvent used for turning the electrode layer (B) into a coating material include alcohol solvents such as methanol and ethanol, glycol solvents such as ethylene glycol and propylene glycol, ether solvents such as diethyl ether and tetrahydrofuran, glycol ether solvents such as ethylene glycol butyl ether and diethylene glycol monoethyl ether acetate, amide solvents such as N,N-dimethylformamide and dimethylacetamide, pyrrolidone solvents such as N-methyl-2-pyrrolidone and 2-pyrrolidone, sulfur solvents such as dimethyl sulfoxide and methyl ethyl sulfoxide, ester solvents such as ethyl acetate and butyl acetate, ketone solvents such as acetone and methyl ethyl ketone, aliphatic solvents such as hexene and heptane, alicyclic solvents such as cyclohexane and methylcyclohexane, aromatic solvents such as benzene and toluene, and water. Of these, when polar solvents such as alcohol solvents, glycol solvents, glycol ether solvents, pyrrolidone solvents, amide solvents, sulfur solvents, and water are used, the dispersibility of carbon fine particles tends to be enhanced, hence they are preferable as the volatile solvent for a conductive coating material. These volatile solvents may be used singly or two or more may be used in combination. A use of two or more volatile solvents in combination is preferable due to easy control of drying properties of a coating material and dispersibility of carbon fine particles.

The conductive coating material can be obtained by uniformly dispersing each of the above raw materials using a typical disperser such as a ball mill, a sand mill, a bead mill, a two-roll mill, a three-roll mill, or a paint shaker.

Specific examples of the coating applicator include a die coater, a bar coater, a comma coater, a lip coater, a roll coater, a curtain coater, a gravure coater, a spray coater, a blade coater, a reverse coater, and an air knife coater. Specific examples of the printing method include screen printing, flexographic printing, gravure printing, relief printing, and offset printing.

The formation of an electrode layer (B) on an electret material (A), more specifically on the surface of a porous resin film, may be carried out before or after the electretization processing.

The formation of an electrode layer (B) on an electret material (A) after subjected to the electretization processing is preferable in an aspect of enabling the prevention of charges from dissipating through an electrode layer (B) at the time of the electretization processing. However, charges stored inside are discharged when a load of the heat from sintering or drying is applied to an electret material (A) at the time of forming an electrode layer (B) likely deteriorating the piezoelectricity, due to which an electrode layer (B) is preferably formed on an electret material (A) before subjected to the electretization processing.

Particularly, the carbon fine particle used for a piezoelectric element of the present invention causes less dissipation of the injected charges through an electrode layer (B) during the electretization processing compared with metal particles, hence preferable for the production method.

[Film Thickness of Electrode Layer (B)]

A film thickness of an electrode layer (B) is 2 to 100 µm. A film thickness of an electrode layer (B) is preferably 5 µm or more, more preferably 8 µm or more, and further preferably 11 µm or more. On the other hand, a film thickness of an electrode layer (B) is preferably 70 µm or less, more preferably 50 µm or less, and further preferably 30 µm. More specifically, a film thickness of an electrode layer (B) is preferably 5 to 70 µm, more preferably 8 to 50 µm, and further preferably 11 to 30 µm. When a thickness of an electrode layer (B) is more than the above ranges, the occurrence of inconsistent signal transduction performances due to unstable resistance values of the electrode layer (B) can be prevented. Additionally, such a film thickness is advantageous from the viewpoint of abrasion resistance. On the other hand, when such a film thickness is less than the above range, the weight of an electrode layer becomes light and vibrations such as a sound are easily transferred to an electret material (A), whereby performances are enhanced at the time of using a piezoelectric element of the present invention as an electrical and electronic input and output device.

[Piezoelectric Element]

A piezoelectric element of the present invention is an element which converts a vibration applied to a piezoelectric element to an electricity or converts an electricity to a vibration by a piezoelectric effect of an electret, i.e., the above electret material (A) after subjected to the electretization processing. The piezoelectric element, which is a conversion element between a vibration and an electricity, can be used as audio equipment such as a microphone, a speaker, and a musical instrument.

The frequencies of a vibration applied to a piezoelectric element of the present invention or a vibration generated at the piezoelectric element are not particularly limited and may be an audible range from about 20 to 20000 Hz or may be an ultrasonic wave range of 20000 Hz or more. A piezoelectric element of the present invention, capable of converting to vibrations of high sound qualities particularly in an audible range, can be preferably used for musical instruments.

[Musical Instruments]

A musical instrument of the present invention is provided with the aforementioned piezoelectric element of the present invention. Thus, a musical instrument with a high quality, which converts a sound or a vibration detected by the piezoelectric element to an electrical signal and outputs or converts an electrical signal to a sound and outputs, can be provided. Examples of the musical instrument of the present invention include stringed instruments such as an electric acoustic guitar, a classical guitar, a violin, a cello, a mandolin, and a piano, and percussion instruments. The piezoelectric element can be typically installed to a vibrator of a musical instrument or the like. For example, as described in Japanese Patent Laid-Open No. 2017-67763, installation of a piezoelectric element to a vibrator such as a sound board of an electric acoustic guitar can provide an electric acoustic guitar which converts vibrations of strings to electrical signals by the piezoelectric element and outputs.

[Evaluation Method]

[Porosity]

The calculation method of the porosity of an electret material (A) having pores inside is as described in detail in the section wherein the aforementioned porous resin film is described.

[Thickness]

The thickness of a piezoelectric element is determined in accordance with JIS K7130: 1999 using a constant pressure thickness gauge (product name: PG-01J, manufactured by TECLOCK). Further, the thickness ratio of an electrode layer (B) in a piezoelectric element is determined by cooling the piezoelectric element to a temperature of −60° C. or less using liquid nitrogen, cutting the sample laid on a glass plate with a razor blade positioned at a right angle to prepare the sample for cross section measurement, making a cross-sectional observation on the obtained sample by using a scanning electron microscope to discriminate boundary lines of each layer based on composition appearances.

The thickness of an electrode layer (B) is determined by multiplying a thickness of the piezoelectric element by a thickness ratio of the electrode layer (B).

[Surface Resistivity]

The surface resistivity of an electrode layer (B) is a value obtained by multiplying a resistance (R), which is measured by a four-point probe array in accordance with JIS-K7194: 1994 under conditions of a temperature of 23° C. and a relative temperature of 50%, by a correction coefficient F. In some of the Comparative Examples to be described later, the surface resistivity of 1×10 Ω/sq. or more is a value measured in accordance with JIS-K-6911 using an electrode of double ring method.

A surface resistivity of the electrode layer (B) in a piezoelectric element of the present invention is desirably within a range from 1 to 1000 Ω/sq. When a surface resistivity is 1000 Ω/sq. or less, a transduction efficiency of electrical signals is good whereby performances as a material for an electrical and electronic input and output device tend to be enhanced. On the other hand, for providing an electrode layer (B) having a surface resistivity of less than 1 Ω/sq., the electrode layer (B) must be thick, however, a surface resistivity of 1 Ω/sq. or more is preferable from the viewpoint of transferring vibrations such as a sound, although the transduction of electrical signals in this case is not a problem.

EXAMPLE

Hereinafter, the present invention is further described in detail in reference to Examples, Comparative Examples, and Test Examples. The following materials, amounts used, ratios, and operations may be altered as necessary without departing from the spirits of the present invention. Accordingly, the scope of the present invention is not limited to the specific examples illustrated below.

Table 1 collectively shows materials used in Production Examples of porous resin films constituting a piezoelectric element of the present invention. Note that the % used below refers to mass % unless otherwise stated.

[Preparation Example of Resin Compositions]

Thermoplastic resins, a pore-forming nucleating agent, and a dispersant described in Table 1 were mixed in mixing ratios described in Table 1, melt-kneaded using a biaxial kneader set at 210° C., subsequently extruded in a strand shape using an extruder set at 230° C., after cooled, cut using a strand cutter to prepare pellets of a resin composition (a) and a resin composition (b), respectively.

TABLE 1

| | Material name | Content | Resin composition (a) | Resin composition (b) |
|---|---|---|---|---|
| Porous resin film mixture (mass %) | Thermoplastic resin | Propylene homopolymer (product name: Novatec PP FY4, manufactured by Japan Polypropylene Corporation, MFR (230° C., 2.16 kg load): 5 g/10 min, melting point: 162° C., Density: 0.91 g/cm$^3$) | 71.8 | 99 |
| | | High-density polyethylene (Product name: Novatec HD HJ360, manufactured by Japan Polyethylene Corporation, MFR (190° C., 2.16 kg load): 5.5 g/10 min, melting point: 131° C., density: 0.95 g/cm$^3$) | 10 | 0 |
| | Pore-forming nucleating agent | Heavy calcium carbonate powder (product name: BF100, Bihoku Funka Kogyo Co., Ltd., median size D50: 10.1 μm, density: 2.7 g/cm$^3$) | 18 | 1 |
| | Dispersant | Oleic acid (product name: Lunac OA, manufactured by Kao Corporation) | 0.2 | 0 |

[Production Example of a Porous Resin Film]

The resin composition (a) obtained in the above Preparation Example, as a core layer, was melt-kneaded using a single extruder set at 230° C. Further, the resin composition (b), as a skin layer, was melt-kneaded using 2 extruders set at 230° C. These were fed to a feedblock-type multilayer coextrusion T-die set at 250° C., laminated in such a way as to be in an order of skin layer/core layer/skin layer in the die, and extruded in a sheet shape. The sheet was cooled to 60° C. using a cooling device, whereby a non-stretched sheet having a three layer structure and consisting of the resin compositions (b)/(a)/(b) was obtained.

The obtained non-stretched sheet was heated to 135° C., uniaxially stretched at a stretch ratio of 5 times in a carrying direction (longitudinal direction, MD direction) of the sheet by a roll-to-roll stretching method utilizing peripheral speed differences of a roll group, and cooled to 60° C. to obtain a uniaxially stretched sheet.

The obtained uniaxially stretched sheet was heated again to 155° C. in a tenter oven, subsequently stretched at a stretch ratio of 8 times in a width direction (cross machine direction, TD direction) of the resin sheet by a clip stretching method using a tenter stretching machine, and further heated to 160° C. in an over to carry out heat treatment. Subsequently, the resin sheet was cooled to 60° C., selvages were slit, corona surface discharge treatment was applied to both surfaces, whereby a consecutively biaxially stretched porous resin film was obtained.

The obtained porous resin film, as shown in Table 2, was a laminate sheet of 3 layer structure of (b)/(a)/(b) (the number of stretching axis of each layer: biaxel/biaxel/biaxel, thickness of each layer (μm): 1/63/1, basis weight of each layer (g/m$^2$): 0.9/38.2/0.9) having a thickness of 65 μm and a porosity of 39%.

TABLE 2

| | | | Porous resin film Production Example |
|---|---|---|---|
| Layer structure of porous resin film | Resin composition | | b/a/b |
| | Stretched layer structure | | Biaxel/biaxel/biaxel |
| Stretching conditions when forming porous resin film | MD | Temperature (° C.) | 135 |
| | | Ratio (times) | 5 |
| | TD | Temperature (° C.) | 155 |
| | | Ratio (times) | 8 |
| Properties of porous resin film | Thickness (thickness of each layer) (μm) | | 65 (1/63/1) |
| | Basis weight (basis weight of each layer) (g/m$^2$) | | 40 (0.9/38.2/0.9) |
| | Porosity (%) | | 39 |

[Preparation Examples of Conductive Coating Materials 1 to 4]

An unsaturated polyester resin (product name: VYLON 200, manufactured by Toyobo Co., Ltd., Tg: 67° C.) as a binder component and diethylene glycol monoethyl ether acetate as a volatile solvent were mixed in a mass ratio of 50:50 and stirred for 4 hours while heated to 100° C. in an autoclave thereby to obtain a binder solution wherein the unsaturated polyester resin was dissolved in the solvent.

Subsequently, a carbon fine particle 1, a carbon fine particle 2, a dispersant, and a solvent described in Table 3 were mixed in mixing ratios described in Table 3. The mixture was kneaded three times using a 3-roll mill (product name: BR-100V, manufactured by Aimex Co., Ltd.), the binder solution obtained earlier was added in mixing ratios described in Table 3, and the mixture was further kneaded three times using the 3-roll mill thereby to obtain the conductive coating materials of Preparation Examples 1 to 4.

TABLE 3

| Material | | Preparation Example | | | |
|---|---|---|---|---|---|
| | name | Content | 1 | 2 | 3 | 4 |
| Conductive coating material mixture (mass part) | Carbon fine particle 1 | Flaky graphite (product name: CNP15, manufactured by Ito Graphite Co., Ltd., average particle size: 15 µm, ash content: 0.2 wt %) | 35 | 20 | 10 | 55 |
| | Carbon fine particle 2 | Carbon black (product name: Ketjenblack EC300J, manufactured by Lion Specialty Chemicals Co., Ltd., average primary particle size: 39.5 nm, DBP oil absorption amount: 360 $cm^3$/100 g( BET specific surface area: 800 $m^2$/g) | 15 | 10 | 5 | 20 |
| | Binder solution | Solution wherein an unsaturated polyester resin (product name: VYLON 200, manufactured by Toyobo Co., Ltd., Tg: 67° C.) and diethylene glycol monoethyl ether acetate were mixed in a ratio of 50:50, heated to 100° C. in an autoclave, and stirred for 4 hours to dissolve the resin | 98 | 138 | 168 | 48 |
| | Dispersant | Stearamide (Wako Pure Chemical Industries Ltd., reagent glade) | 1 | 1 | 1 | 1 |
| | Solvent | Diethylene glycol monoethyl ether acetate (Tokyo Chemical Industry Co., Ltd., reagent glade) | 101 | 81 | 38 | 376 |
| Solid-content concentration of conductive coating material (%) | | | 40 | 40 | 45 | 20 |
| Content of carbon fine particle in solid content (%) | | | 50 | 30 | 15 | 75 |

[Preparation Example 5 of Conductive Coating Material]

A commercial conductive coating material containing silver particles (product name: DOTITE D-500, manufactured by Fujikura Kasei Co., Ltd.) was used.

Example 1. Comparative Example 3

The porous resin film obtained in the above Production Example was cut into a square of 20 cm in length×20 cm in width. A conductive coating material described in Table 4 was printed on one surface of the cut film into a square of 10 cm in length×10 cm in width at the film's central part in such a way that a thickness after dried was the thickness described in Table 4 using a screen printer (product name: SSA-TF150E, manufactured by SERIA CORPORATION) and a screen plate with 120 lines, and dried at 80° C. for 1 hours in an oven thereby to provide an electrode layer (B).

A conductive coating material described in Table 4 was printed on the other surface of the porous resin film provided with the electrode layer (B) into a square of 10 cm in length×10 cm in width at the film's central part in such a way that a thickness after dried was the thickness described in Table 4 using the same screen printer and screen plate so that the upper and lower electrode layers were in the same position and dried at 80° C. for 24 hours in an oven thereby to obtain a porous resin film provided with the electrode layers (B) on both surfaces.

Electretization processing was applied to the porous resin film provided with the electrode layers (B) on both surfaces to electretize the porous resin film thereby to obtain the piezoelectric elements of Example 1 and Comparative Example 3. The electretization processing had conditions under which, as described in FIG. 2, the porous resin film 8 provided with the electrode layers (B) was placed on a board of a ground electrode 7 of an electretization device, a needle electrode 6 designed to have an interneedle distance of 10 mm was set in such a way that a distance of the needle electrode-ground electrode was 10 mm, and a direct current at a voltage of −10 KV was applied to the needle electrode for 5 seconds.

Example 2. Comparative Examples 1 and 2

The porous resin film obtained in the above Production Example was cut into a square of 20 cm in length×20 cm in width. A conductive coating material described in Table 4 was printed on one surface of the cut film into a square of 10 cm in length×10 cm in width at the film's central part in such a way that a thickness after dried was the thickness described in Table 4 using a screen printer (product name: SSA-TF150E, manufactured by SERIA CORPORATION) and a screen plate with 80 lines, and dried at 80° C. for 1 hour in an oven thereby to provide an electrode layer (B).

The same conductive coating material was printed on the other surface of the porous resin film provided with the electrode layer (B) into a square of 10 cm in length×10 cm in width at the film's central part in such a way that a thickness after dried was the thickness described in Table 4 using the same screen printer and screen plate so that the upper and lower electrode layers (B) were in the same position, and dried at 80° C. for 24 hours in an oven thereby to obtain a porous resin film provided with the electrode layers (B) on both surfaces.

Electretization processing was applied to the porous resin film provided with the electrode layers (B) on both surfaces to electretize the porous resin film thereby to obtain the piezoelectric elements of Example 2 and Comparative Examples 1 and 2. The electretization processing had conditions under which, as described in FIG. 2, the porous resin film 8 provided with the electrode layers (B) was placed on a board of a ground electrode 7 of an electretization device, a needle electrode 6 designed to have an interneedle distance of 10 mm was set in such a way that a distance of the needle electrode-ground electrode was 10 mm, and a direct current at a voltage of −10 KV was applied to the needle electrode for 5 seconds.

Example 3

The porous resin film obtained in the above Production Example was cut into a square of 20 cm in length×20 cm in width. The conductive coating material of Preparation Example 5 was printed on one surface of the cut film into a square of 10 cm in length×10 cm in width at the film's central part in such a way that a thickness after dried was a thickness of 1 μm using a multipurpose print testing equipment (product name: K303 Multi Coater, manufactured by RK PrintCoat Instruments Ltd.) and a gravure plate with 400 lines, and dried at 80° C. for 1 hour in an oven thereby to provide an electrode layer (B).

The conductive coating material of Preparation Example 1 was printed on the other surface of the porous resin film provided with the electrode layer (B) into a square of 10 cm in length×10 cm in width at the film's central part in such a way that a thickness after dried was a thickness of 20 μm using a screen printer (product name: SSA-TF150E, manufactured by SERIA CORPORATION) and a screen plate with 80 lines so that the upper and lower electrode layers were in the same position, and dried at 80° C. for 24 hours in an oven thereby to obtain a porous resin film provided with the electrode layers (B) on both surfaces.

Electretization processing was applied to the porous resin film provided with the electrode layers (B) on both surfaces to electretize the porous resin film thereby to obtain the piezoelectric elements of Example 3. The electretization processing had conditions under which, as described in FIG. 2, the porous resin film 8 provided with the electrode layers (B) was placed on a board of a ground electrode 7 of an electretization device in such a way that the electrode layer (B) consisting of the conductive coating material of Preparation Example 1 faced a needle electrode 6 and the electrode (B) consisting of the conductive coating material of Preparation Example 5 faced the ground electrode 7, the needle electrode 6 designed to have an interneedle distance of 10 mm was set in such a way that a distance of the needle electrode-ground electrode was 10 mm, and a direct current at an voltage of −10 KV was applied to the needle electrode for 5 seconds.

Comparative Example 4

The porous resin film obtained in the above Production Example was cut into a square of 20 cm in length×20 cm in width. The conductive coating material of Preparation Example 5 was printed on one surface of the cut film into a square of 10 cm in length×10 cm in width at the film's central part in such a way that a thickness after dried was a thickness of 12 μm using a multipurpose print testing equipment (product name: K303 Multi Coater, manufactured by RK PrintCoat Instruments Ltd.) and a gravure plate with 400 lines, and dried at 80° C. for 1 hour in an oven thereby to provide an electrode layer (B).

The conductive coating material of Preparation Example 5 was printed on the other surface of the porous resin film provided with the electrode layer (B) into a square of 10 cm in length×10 cm in width at the film's central part in such a way that a thickness after dried was a thickness of 12 μm using the same multipurpose print testing equipment and a gravure plate so that the upper and lower electrode layers were in the same position, and dried at 80° C. for 24 hours in an oven thereby to obtain a porous resin film provided with the electrode layers (B) on both surfaces.

Electretization processing was applied to the porous resin film provided with the electrode layers (B) on both surfaces to electretize the porous resin film thereby to obtain the piezoelectric element of Comparative Example 4. The electretization processing had conditions under which, as described in FIG. 2, the porous resin film 8 provided with the electrode layers (B) was placed on a board of a ground electrode 7 of an electretization device, a needle electrode 6 designed to have an interneedle distance of 10 mm was set in such a way that a distance of the needle electrode-ground electrode was 10 mm, and a direct current at a voltage of −10 KV was applied to the needle electrode for 5 seconds.

Comparative Example 5

The porous resin film obtained in the above Preparation Example was cut into a square of 20 cm in length×20 cm in width. An adhesive coating material, wherein a polyether adhesive (product name: TM-317, Toyo-Morton, Ltd.) and an isocyanate curing agent (product name: CAT-11B, Toyo-Morton, Ltd.) were mixed in a mass ratio of 50:50 and diluted with ethyl acetate to a solid-content concentration of 25%, was applied throughout one entire surface of the cut film using a bar coater in such a way that a coating thickness after dried was 2 μm, and dried at 40° C. for 1 minute in an oven. Aluminum-deposited PET (product name: Tetolight PC, manufactured by OIKE & Co., Ltd., thickness 12 μm) was cut into a square of 10 cm in length×10 cm in width and laminated on the film's central part so that the surface on which aluminum was not deposited (PET surface) was in contact with the adhesive to provide an electrode layer (B).

An electrode layer (B) was also provided on the other surface of the porous resin film by the same procedure and subsequently the adhesive was cured at 40° C. for 24 hours in an oven thereby to obtain a porous resin film provided with the electrode layers (B) on both surfaces.

Electretization processing was applied to the porous resin film provided with the electrode layers (B) on both surfaces to electretize the porous resin film thereby to obtain the piezoelectric elements of Comparative Example 5. The electretization processing had conditions under which, as described in FIG. 2, the porous resin film 8 provided with the electrode layers (B) was placed on a board of a ground electrode 7 of an electretization device, a needle electrode 6 designed to have an interneedle distance of 10 mm was set in such a way that a distance of the needle electrode-ground electrode was 10 mm, and a direct current at a voltage of −10 KV was applied to the needle electrode for 5 seconds.

Test Example

In the following test, the surface on which the electrode layer (B) as described as Upper electrode layer (B) in Table 4 was provided was the evaluation surface.

(Sound Pressure)

Figure 4:
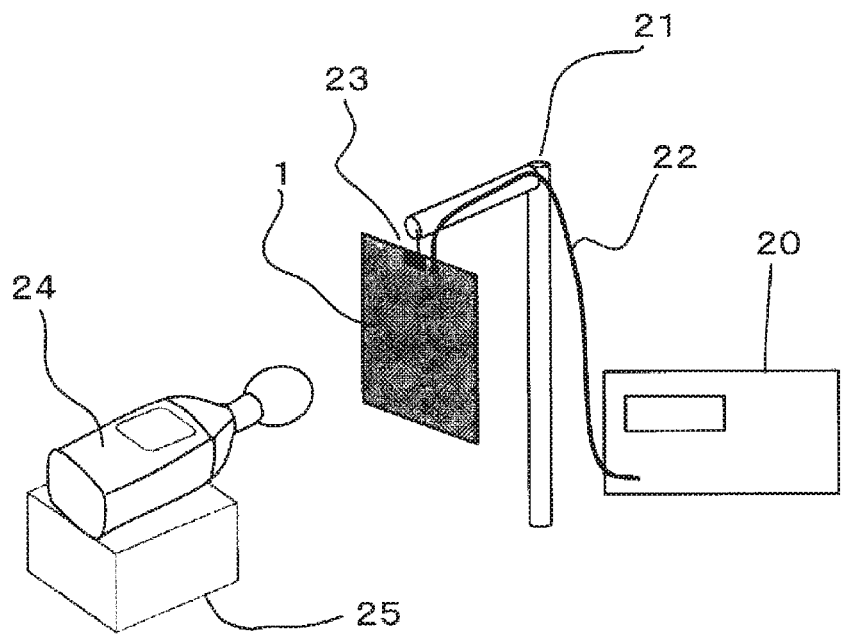
FIG. 4 is a schematic diagram of a sound pressure level measuring device used in Test Example of the present invention.

A section of 10 cm in length×10 cm in width having the electrode of the piezoelectric elements of Examples 1 to 3 and Comparative Examples 1 to 5 was cut out to prepare samples. As shown in FIG. 4, a lead wire 22 was attached to the front and back surfaces of the prepared sample 1 using a conductive tape (product name: AL-25BT, manufactured by Sumitomo 3M), the sample 1 of the piezoelectric element was suspended from a support 21 while pinched using a fixing clip 23 so that the evaluation surface faced a sound pressure level meter. The lead wire 22 was connected to a function generator (product name: AD-8624A, manufactured by A & D Company, Limited) 20, and the function generator 20 was set at a frequency: 11,220 Hz and an output voltage: 15 V (maximum) to apply a voltage, whereby a sound pressure was generated using the piezoelectric element as a speaker.

The sound pressure generated by the piezoelectric element was measured with a sound pressure level meter (product name: SL-1370, manufactured by CUSTOM Corporation) 24 put at a distance of 10 cm facing the center front of the sample 1 of the piezoelectric element and evaluated using the following criteria. The sound pressures measured and evaluation results are shown in Table 4. Note that a sound pressure level at the measurement environment was 40 dB.

A: Good Sound: pressure was 60 dBmV or more

B: Slightly poor: Sound pressure was 50 dBmV or more and less than 60 dBmV

C: Poor: Sound pressure was less than 50 dBmV

C: Poor: Maximum voltage (average value) was less than 10 mV (Abrasion Resistance)

The point, at which the iron ball 12 fell on the evaluation surface of the above sample of which the generated voltages were measured, was rubbed 10 times using an eraser and an average value of the maximum voltages measured by the same procedure as above was calculated again to evaluate using the above criteria. The average values of maximum voltages measured and evaluation results are shown in Table 4.

TABLE 4

| | | | Example | | | Comparative Example | | | | |
|---|---|---|---|---|---|---|---|---|---|---|
| | | | 1 | 2 | 3 | 1 | 2 | 3 | 4 | 5 |
| Structure of piezoelectric element | Upper electrode layer (B) (evaluation surface) | Electrode type | Preparation Example 1 | Preparation Example 2 | Preparation Example 1 | Preparation Example 3 | Preparation Example 4 | Preparation Example 5 | Preparation Example 5 | Deposited PET |
| | | Thickness (μm) | 12 | 20 | 20 | 20 | 20 | 1 | 12 | 12 |
| | | Surface resistivity (Ω/sq.) | 50 | 100 | 10 | 5000 | 200 | 2 | 0.05 | 0.1 |
| | Electret material | | Production Example 1 | Production Example 1 | Production Example 1 | Production Example 1 | Production Example 1 | Production Example 1 | Production Example 1 | Production Example 1 |
| | Lower electrode layer (B) | Electrode type | Preparation Example 2 | Preparation Example 2 | Preparation Example 5 | Preparation Example 3 | Preparation Example 4 | Preparation Example 5 | Preparation Example 5 | Deposited PET |
| | | Thickness (μm) | 12 | 90 | 1 | 20 | 20 | 1 | 12 | 12 |
| | | Surface resistivity (Ω/sq.) | 50 | 100 | 2 | 5000 | 200 | 2 | 0.05 | 0.1 |
| | Total basis weight (g/cm$^2$) | | 84 | 104 | 85 | 100 | 108 | 57.2 | 158.4 | 86 |
| Evaluation item | Sound pressure (dB) | | A 70 | A 65 | A 70 | B 50 | A 65 | A 70 | C 45 | B 55 |
| | Generated voltage (mV) | | A 300 | A 270 | A 310 | A 250 | C Not measurable | A 320 | B 100 | A 200 |
| | Generated voltage after abrasion test (mV) | | A 280 | A 280 | A 300 | A 250 | C Not measurable | B 60 | B 100 | B 170 |

(Generated voltage)

Figure 3:
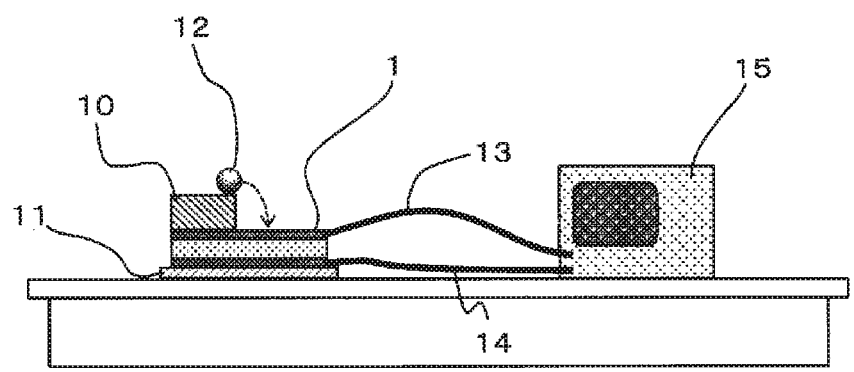
FIG. 3 is a schematic diagram of a falling ball test apparatus used in Test Example of the present invention.

A section of 10 cm in length×10 cm in width having the electrode of the piezoelectric elements of Examples 1 to 3 and Comparative Examples 1 to 5 was cut out to prepare samples. As shown in FIG. 3, lead wires 13 and 14 were attached to the front and back surfaces of the prepared sample 1 using a conductive tape (product name: AL-25BT, manufactured by Sumitomo 3M). The sample 1 of the piezoelectric element was placed on an insulating sheet (flexible vinyl chloride sheet, thickness 1 mm) 11 of a falling ball apparatus so that the evaluation surface faced up. Further, an acrylic plate (thickness 5 mm) 10 was put on the sample 1 of the piezoelectric element and an iron ball 12 having a diameter of 9.5 mm and a weight of 3.5 g was put on the acrylic plate 10.

The iron ball 12 was caused to fall down from the acrylic plate 10 onto the sample 1 of the piezoelectric element and electrical signals from the sample 1 were taken into a high speed recorder (product name: GR-7000, manufactured by KEYENCE CORPORATION) 15. Maximum voltages generated by impacts of falling ball were measured 10 times to calculate an average value and evaluations were made using the following criteria. The average values of maximum voltages measured and evaluation results are shown in Table 4.

A: Good: Maximum voltage (average value) was 200 mV or more

B: Slightly poor: Maximum voltage (average value) was 10 mV or more and less than 200 mV As shown in Table 4, it is revealed that the piezoelectric elements of Examples 1 to 3 are good in both an ability to convert electrical signals to vibrations (positive piezoelectricity effect) and an ability to convert kinetic energies to electrical signals (inverse piezoelectricity effect), and also good in the abrasion resistance. The piezoelectric elements of the present invention can withstand a long-term repetitive use and an external force due to such a good abrasion resistance.

Further, it is revealed that any of the performances is deteriorated in Comparative Examples 1 and 2 wherein the contents of carbon fine particles in the electrode layers (B) are outside the range of the present invention and Comparative Examples 3 to 5 wherein carbon fine particles are not used in the electrode layers (B).

INDUSTRIAL APPLICABILITY

A piezoelectric element of the present invention can be utilized for a speaker, a headphone, a ultrasonic vibrator, a ultrasonic motor, a vibration control device, a microphone, a ultrasonic sensor, a pressure sensor, an acceleration sensor, a strain sensors, a fatigue crack sensor, a medical sensor, a measuring instrument, a control device, an abnormality diagnosis system, a security device, a stabilizer, a robots, a musical instrument such as a percussion instrument, a game machine, and a power generator, and can significantly contribute to these industrial fields.

The present application claims priority based on a Japanese Patent Application No. 2016-231946 filed on Nov. 30, 2016 and the entire contents disclosed in the Japanese Patent Application are incorporated by reference herein.

REFERENCE SIGNS LIST

1 Piezoelectric element
2 Electret material (A)
3 Electrode layer (B)
4 Electrode layer (B)
5 DC high voltage power supply
6 Needle electrode
7 Ground electrode
8 Porous resin film
10 Acrylic plate (thickness 5 mm)
11 Insulating sheet (thickness 1 mm)
12 Iron ball
13 Lead wire
14 Lead wire
15 High speed recorder
20 Function generator
21 Support
22 Lead wire
23 Fixing clip
24 Sound pressure level meter
25 Stand for a sound pressure level meter

The invention claimed is:

1. A piezoelectric element comprising an electrode layer (B) on at least one surface of an electret material (A) having pores inside, wherein
a porosity of the electret material (A) is 20 to 80%,
the electrode layer (B) contains 20 to 70 mass % of a carbon fine particle, and
a thickness of the electrode layer (B) is 2 to 100 μm,
wherein the electrode layer (B) contains 20 to 70 mass % of the carbon fine particle and 30 to 80 mass % of a binder component.

2. The piezoelectric element according to claim 1, wherein the carbon fine particle comprises one or two or more selected from graphite, carbon black, carbon nanofiber, and carbon nanotube.

3. The piezoelectric element according to claim 2, wherein the carbon fine particle comprises graphite and carbon black.

4. The piezoelectric element according to claim 1, wherein
the electret material (A) is a porous resin film and has the electrode layers (B) on both surfaces of the porous resin film.

5. A musical instrument comprising the piezoelectric element according to claim 1.

* * * * *